United States Patent
Hruby et al.

(10) Patent No.: US 7,829,787 B2
(45) Date of Patent: Nov. 9, 2010

(54) TELECOMMUNICATIONS FRAME INCLUDING AN INTERNAL CABLE TROUGH ASSEMBLY

(75) Inventors: Kevin L. Hruby, Minnetonka, MN (US); Glen Cordle, Centerville, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 538 days.

(21) Appl. No.: 11/906,330

(22) Filed: Oct. 1, 2007

(65) Prior Publication Data

US 2010/0006317 A1    Jan. 14, 2010

Related U.S. Application Data

(60) Provisional application No. 60/958,902, filed on Jul. 9, 2007.

(51) Int. Cl.
    *H02G 3/08*    (2006.01)
(52) U.S. Cl. .................... 174/50; 174/535; 174/97; 174/72 A; 385/134; 385/135; 361/826
(58) Field of Classification Search ............ 174/50, 174/68.1, 68.3, 58, 480, 481, 72 A, 72 C, 174/70 C, 88 R, 95, 97, 101, 535; 385/134, 385/135; 248/68.1, 906; 211/26, 189; 361/644, 361/650, 655, 658, 730, 825, 826, 827, 796, 361/797, 802; 220/3.2–3.9, 4.02; 439/535
See application file for complete search history.

(56) References Cited

U.S. PATENT DOCUMENTS

| | | | |
|---|---|---|---|
| 5,067,678 A | | 11/1991 | Henneberger et al. |
| 5,825,962 A | * | 10/1998 | Walters et al. .............. 385/135 |
| 6,250,816 B1 | * | 6/2001 | Johnston et al. ............. 385/135 |
| 6,359,217 B1 | * | 3/2002 | Thompson et al. ............ 174/50 |
| 6,388,891 B1 | * | 5/2002 | Falkenberg et al. ......... 385/135 |
| 6,400,883 B1 | * | 6/2002 | Jennings et al. ............. 385/134 |
| 6,429,376 B1 | | 8/2002 | Mendoza |
| 6,487,356 B1 | * | 11/2002 | Harrison et al. ............. 385/135 |
| 6,504,094 B2 | * | 1/2003 | Woo et al. ...................... 174/50 |
| 6,739,795 B1 | | 5/2004 | Haataja et al. |
| 6,838,616 B2 | * | 1/2005 | Harrison et al. ............... 174/50 |
| 7,218,827 B2 | * | 5/2007 | Vongseng et al. ............ 385/135 |
| 7,454,115 B2 | * | 11/2008 | Allen ........................ 385/135 |
| 7,592,543 B2 | * | 9/2009 | Caveney et al. ............. 385/135 |
| 7,627,223 B1 | * | 12/2009 | Burek et al. ................. 385/135 |
| 2002/0160660 A1 | | 10/2002 | Mendoza |
| 2005/0092505 A1 | | 5/2005 | Mendoza |

OTHER PUBLICATIONS

ADC Glide Cable Management Cross-Connect and Inter-Connect Guide; ADCP-92-016; Issue 2; Jul. 2002; 12 pgs.
ADC Fiber Breakout Bay Cable Routing Guide; ADCP-90-329; Issue 1; May 2002; 8 pgs.

* cited by examiner

*Primary Examiner*—Angel R Estrada
(74) *Attorney, Agent, or Firm*—Merchant & Gould P.C.

(57) ABSTRACT

A telecommunications system including a frame to which telecommunications equipment is mounted. Fiber cables exiting the equipment are routed upward along each of the right and left sides of the frame. The fiber cables routed along the right and left sides merge within a horizontal trough section of a cable exit assembly. The cable exit assembly is located adjacent to the top of the frame and defines a single common exit point at which the merged fiber cables exit the frame.

36 Claims, 10 Drawing Sheets

TELECOMMUNICATIONS FRAME INCLUDING AN INTERNAL CABLE TROUGH ASSEMBLY

CROSS-REFERENCE TO RELATED APPLICATIONS

This application claims the benefit of U.S. Provisional Application Ser. No. 60/958,902, filed Jul. 9, 2007; which application is incorporated herein by reference.

FIELD OF THE INVENTION

The present disclosure relates generally to devices for use in the telecommunications industry, and various methods associated with such devices. More particularly, this disclosure relates to a cable routing assembly for telecommunication cables.

BACKGROUND OF THE INVENTION

In telecommunication facilities, telecommunications equipment is mounted to one of a number of framework structures (e.g., cabinets or racks). A vast number of cables are run from, to, and between the equipment mounted to the framework structures. Within each framework structure, cables interconnected to the equipment are routed up vertical cable pathways located along the sides of the structure. The vertically routed cables exit the framework structure at top openings located adjacent to each vertical cable pathways. The cables are then typically routed to overhead cable troughs or ladders, and from there, to other equipment or framework structures.

Such conventional cable routing arrangements require the user to manage the vast number of cables exiting the top of the structures from at least two exiting locations. Cable organization and management of such arrangements can be difficult. In general, conventional arrangements for managing cables can be improved.

SUMMARY OF THE INVENTION

The present disclosure relates to a telecommunications system including a cable exit assembly that defines a single common outlet or exit for telecommunication cables. The system generally includes a frame, such as a cabinet frame, having vertical cable pathways located at right and left sides of the frame. Cables routed with the vertical cable pathways transition into a horizontal trough section of the cable exit assembly. In the horizontal trough section, the cables from each of the right and left vertical cable pathways are merged. The merged cables then transition from a horizontal routing to a vertical routing defined by a vertical cable trough section. The vertical cable trough section defines the single common outlet for the telecommunication cables.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
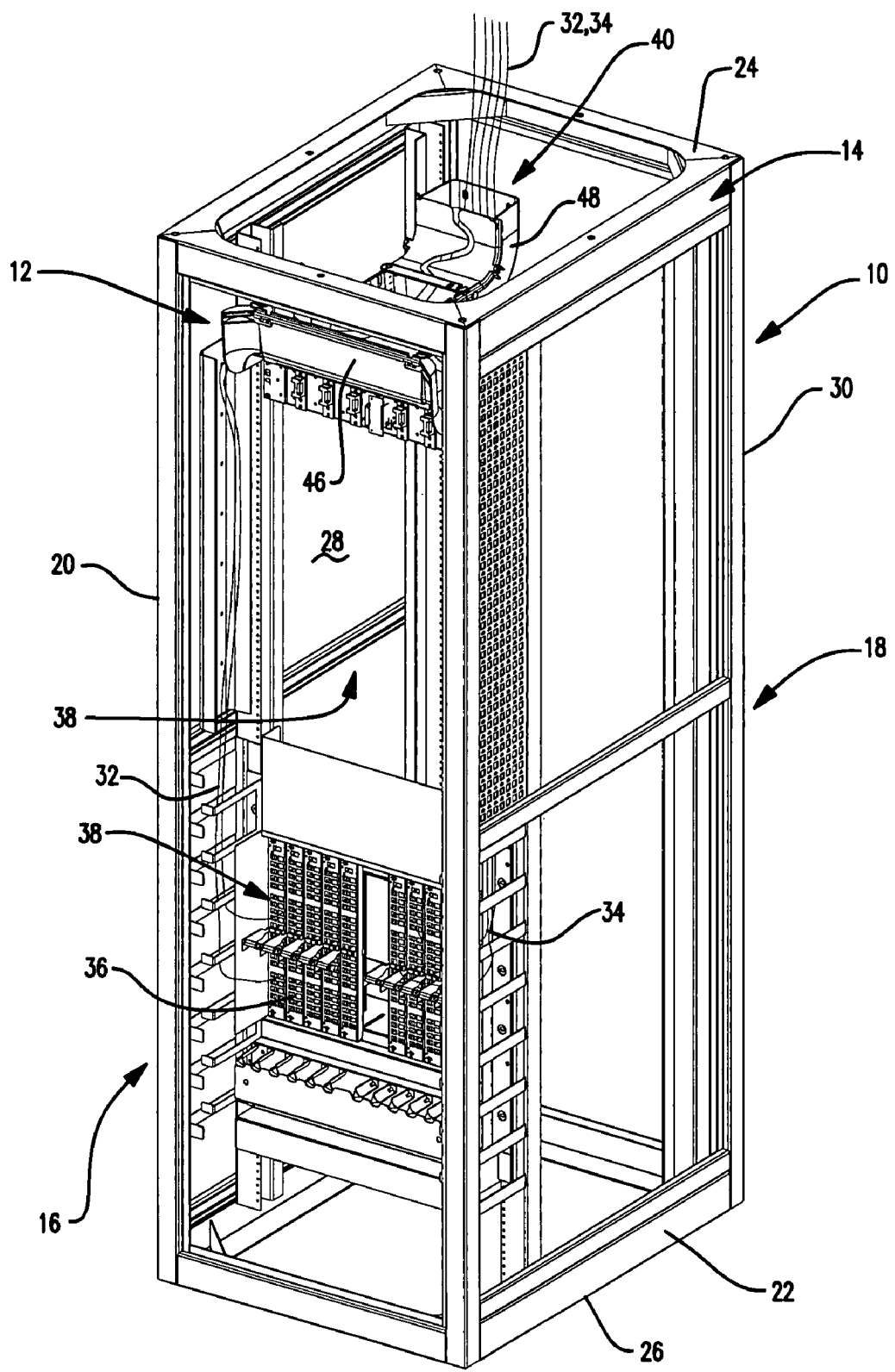
FIG. 1 is a front perspective view of one embodiment of a telecommunications system including a cable exit assembly in accordance with the principles disclosed.

FIG. 1 illustrates one embodiment of a telecommunications system 10 including a cable exit assembly 12 in accordance with the principles disclosed. The cable exit assembly 12 is generally constructed of a durable, non-electrically conducting, plastic material that is highly visible. In the illustrated embodiment, the cable exit assembly 12 is incorporated into a telecommunications cabinet 14. It is to be understood, however, that the present cable exit assembly 12 can be utilized in systems having other equipment structures, such as racks, wall boxes, and other enclosures or framework.

The telecommunications cabinet 14 of the present system 10 generally includes cabinet frame 30 that defines a cabinet front 16, a cabinet rear 18, a first side 20 (e.g., the left side), an opposite second side 22, (e.g., the right side), a top 24, and a bottom 26. The first and second sides 20, 22 extend between the front 16 and rear 18 and the top 24 and bottom 26. Panels or doors (not shown) can be mounted to the cabinet frame 30 at one or more of the front, rear, sides, top, and bottom of the telecommunications cabinet 14 to enclose an interior 28 of the cabinet 14.

Figure 2:
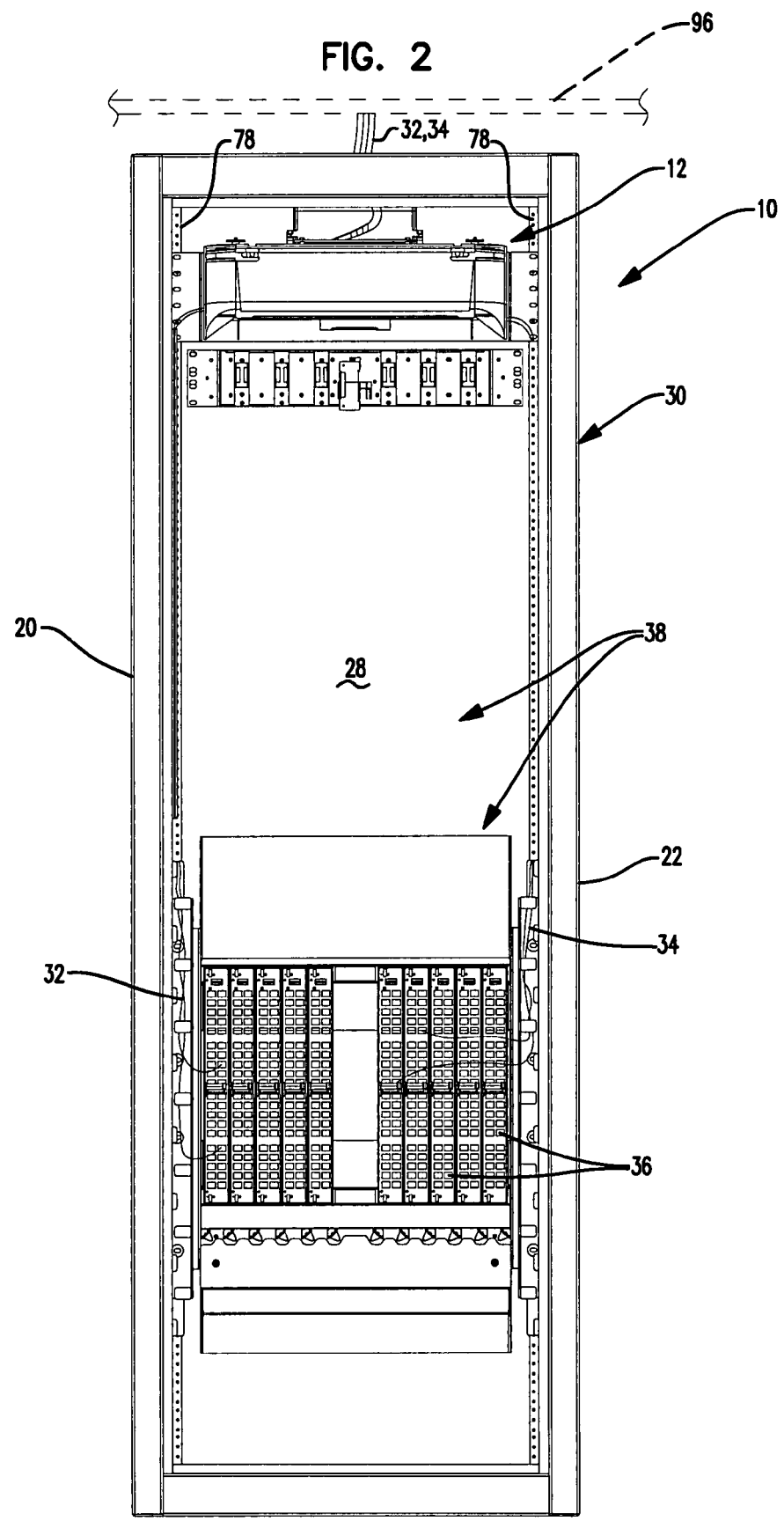
FIG. 2 is a front elevation view of the telecommunications system of FIG. 1.

The interior 28 of the telecommunications cabinet 14 defines an equipment region 38. Equipment 36, either active or passive, is mounted to the cabinet frame 30 within the equipment region 38. In typical telecommunication facilities, such as data centers or central offices, for example, overhead cable pathway structures 96 (e.g., overhead cable troughs or overhead ladder racking, schematically represented in FIG. 2) are hung above the cabinets (e.g., 14), racks, and/or other equipment enclosures or framework. The overhead cable pathway structures 96 carry telecommunication cables that interconnect to the equipment 36 mounted to the cabinet 14.

The present cable exit assembly 12 is designed to collect, route, and protect cables that enter and exit the telecommunications cabinet 14. In particular, the cable exit assembly 12 collects, routes, and protects fiber optic cables 32, 34 that enter/exit the telecommunications cabinet 14

Referring back to FIG. 1, the fiber optic cables 32, 34 interconnected to the equipment 36 and exiting the equipment region 38 are routed vertically within the cabinet interior 28 along either the right side 22 of the cabinet 14 or the left side 20. When the fiber cables reach the top 24 of the cabinet 14, the fiber cables 32, 34 enter the cable exit assembly 12. The cable exit assembly 12 of the present disclosure defines a single common exit point 40 at which the fiber cables exit the cabinet 14. From the one common exit point, the fiber cables 32, 34 are routed to the overhead cable pathway structures 96 and from there to other facility equipment.

Figure 3:
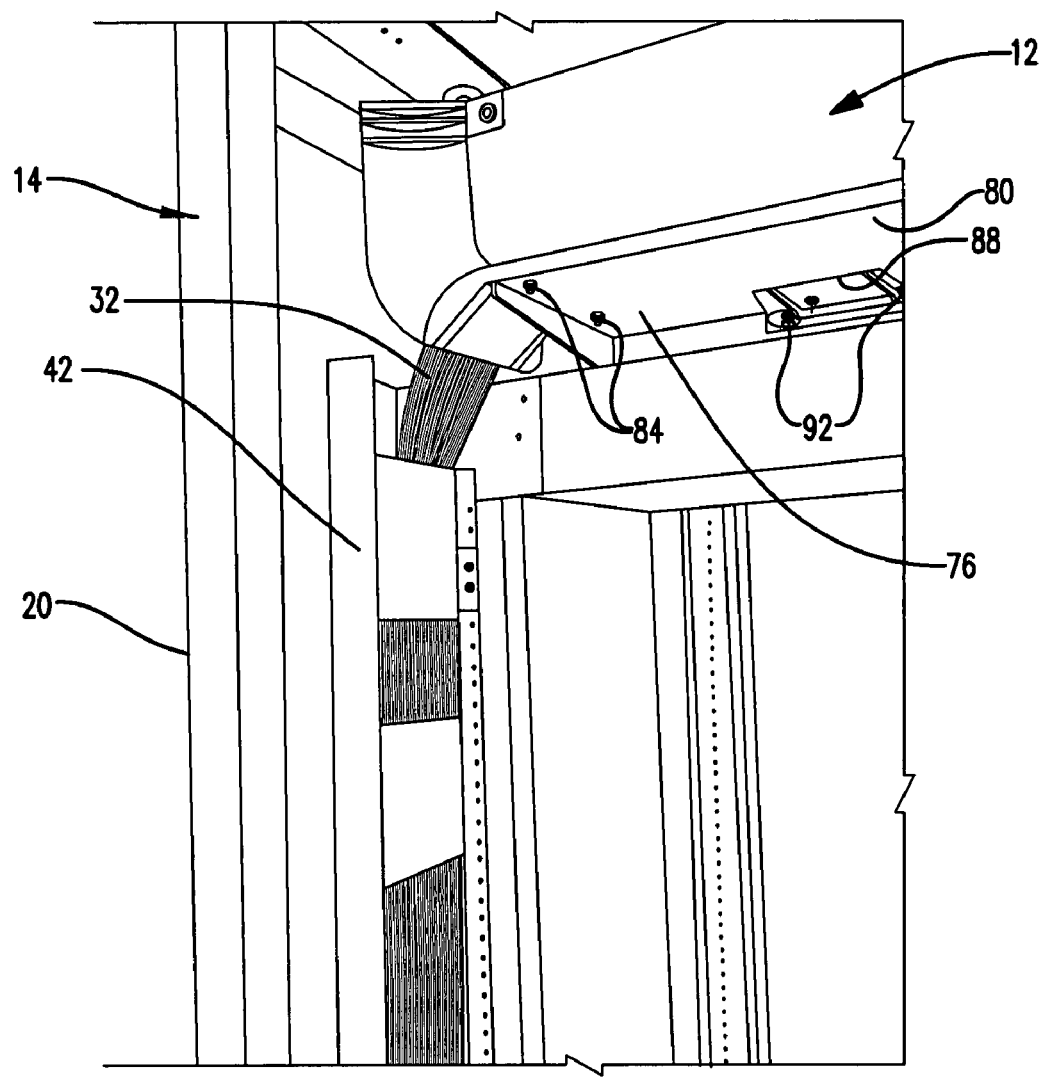
FIG. 3 is a front perspective view of one side of the telecommunications system of FIG. 1.
Figure 4:
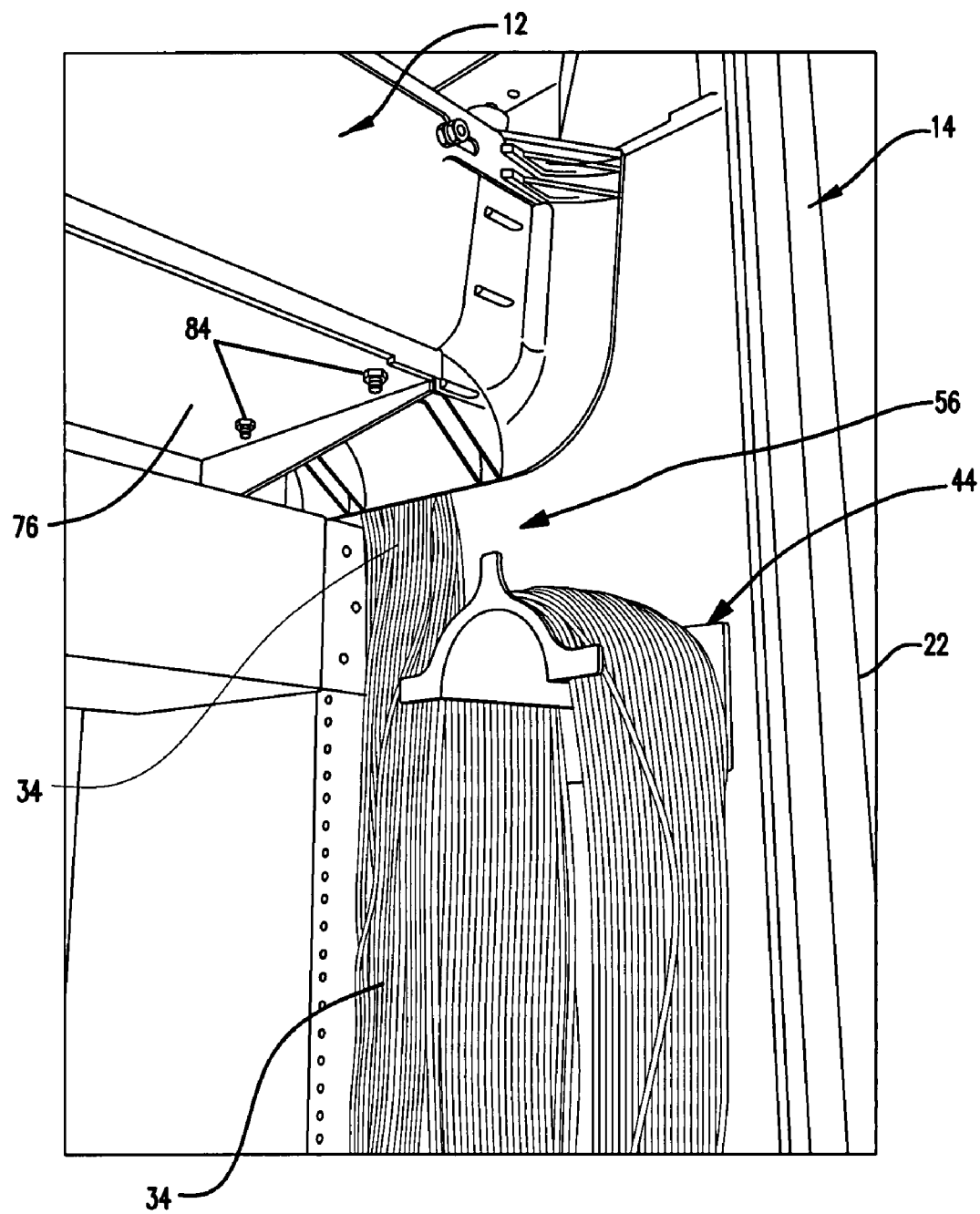
FIG. 4 is a front perspective view of the other side of the telecommunications system of FIG. 1.

Referring now to FIGS. 3 and 4, the present telecommunications cabinet 14 includes first and second vertical cable routing structures 42, 44 located at the opposite sides 20, 22 of the cabinet 14. In the illustrated embodiment, the vertical cable routing structures 42, 44 include spools and/or cable channeling that define vertical cable pathways. In other embodiments, the vertical cable routing structures can also include cable rings or ties that secure the fiber cables 32, 34 along vertical cable pathways. In most applications, the cables 32, 34 are routed laterally from the equipment 36 to one of the vertical cable pathways defined by the first and second vertical cable routing structures 42, 44.

Figure 5:
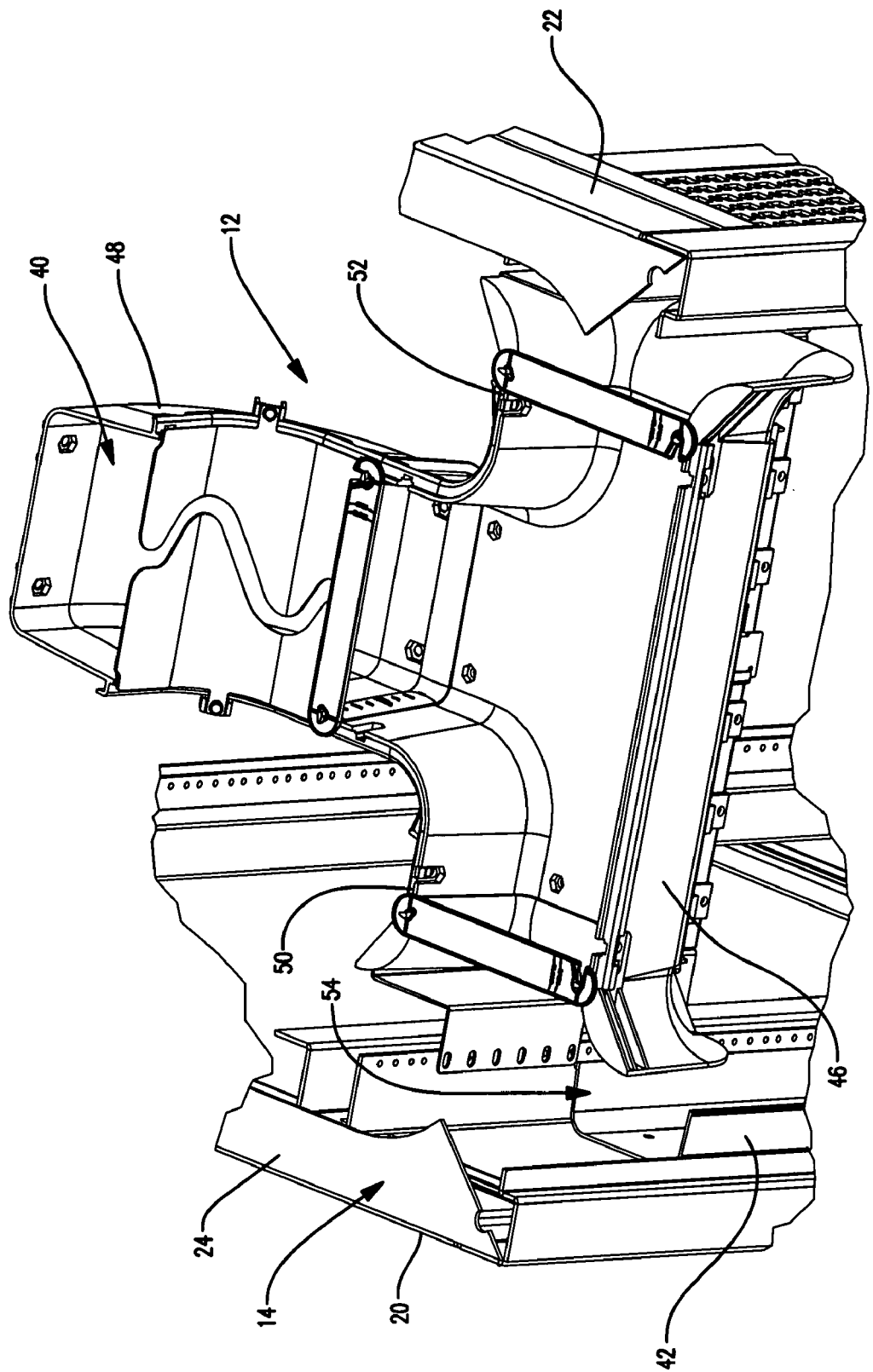
FIG. 5 is a top perspective view of the cable exit assembly of the telecommunications system of FIG. 1.

Referring now to FIGS. 1 and 5, the cable exit assembly 12 is located adjacent to the top 24 of the cabinet 14. The cable exit assembly 12 defines the one common exit point 40 of the cabinet 14 for the exiting fiber cables. The cable exit assembly 12 generally includes a straight horizontal cable trough section 46 (a horizontal T-fitting) and a curved vertical cable trough section 48 (an up elbow).

Figure 6:
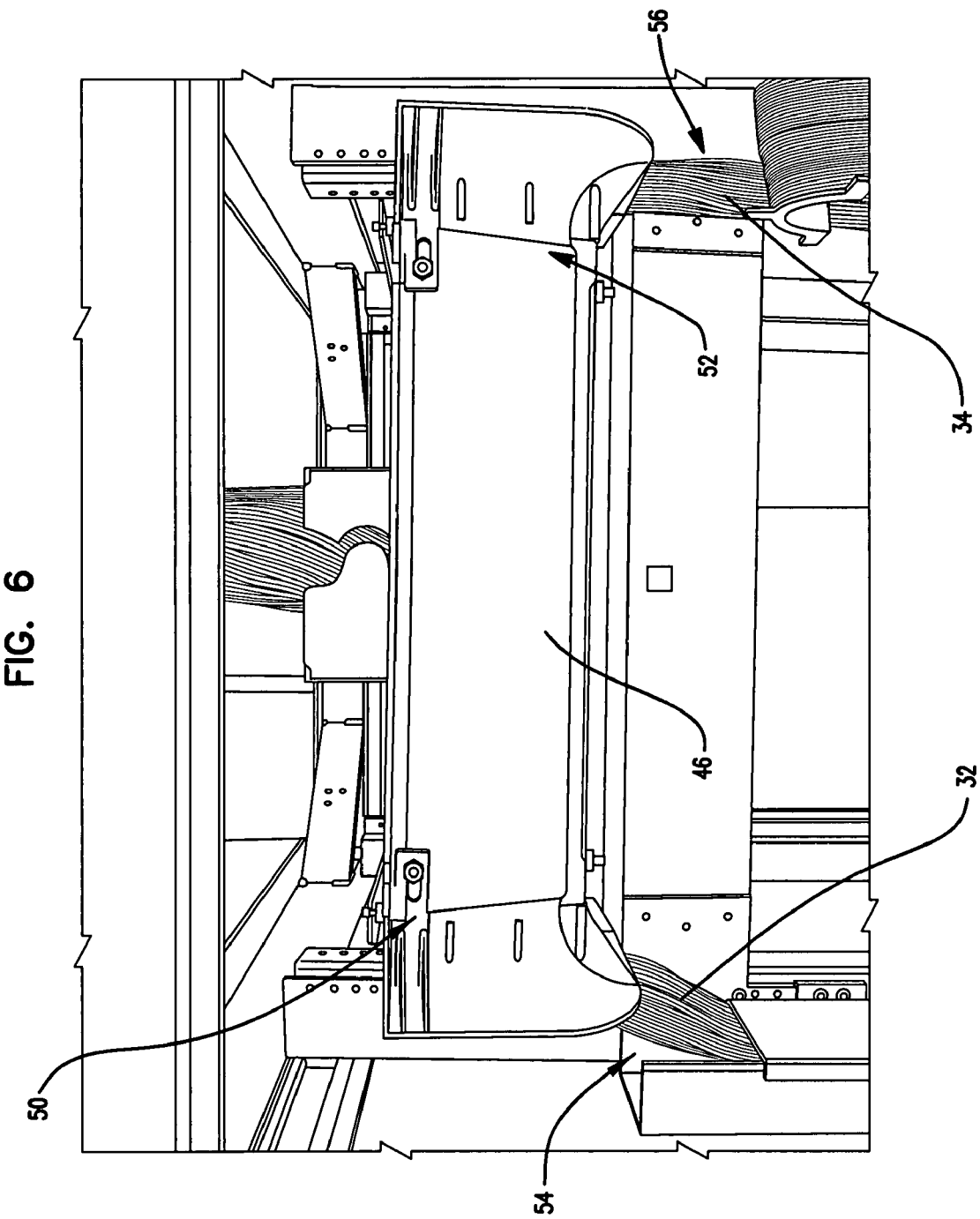
FIG. 6 is a front view of the cable exit assembly of the telecommunications system of FIG. 1.

The horizontal cable trough section 46 of the cable exit assembly 12 extends between the opposing sides 20, 22 of the cabinet frame 30. In particular, and referring to FIG. 6, the horizontal trough section 46 includes a first end 50 and a second end 52. The first end 50 is located adjacent to an exit region 54 of the first vertical cable routing structure 42 at the left side 20 of the cabinet 14. The second end 52 is located adjacent to an exit region 56 of the second vertical cable routing structure 44 at the right side 22 of the cabinet 14. The fiber cables 32, 34 routed within each of the vertical cable routing structures 42, 44 transition to route within the first and second ends 50, 52 of the horizontal trough section 46.

Figure 7:
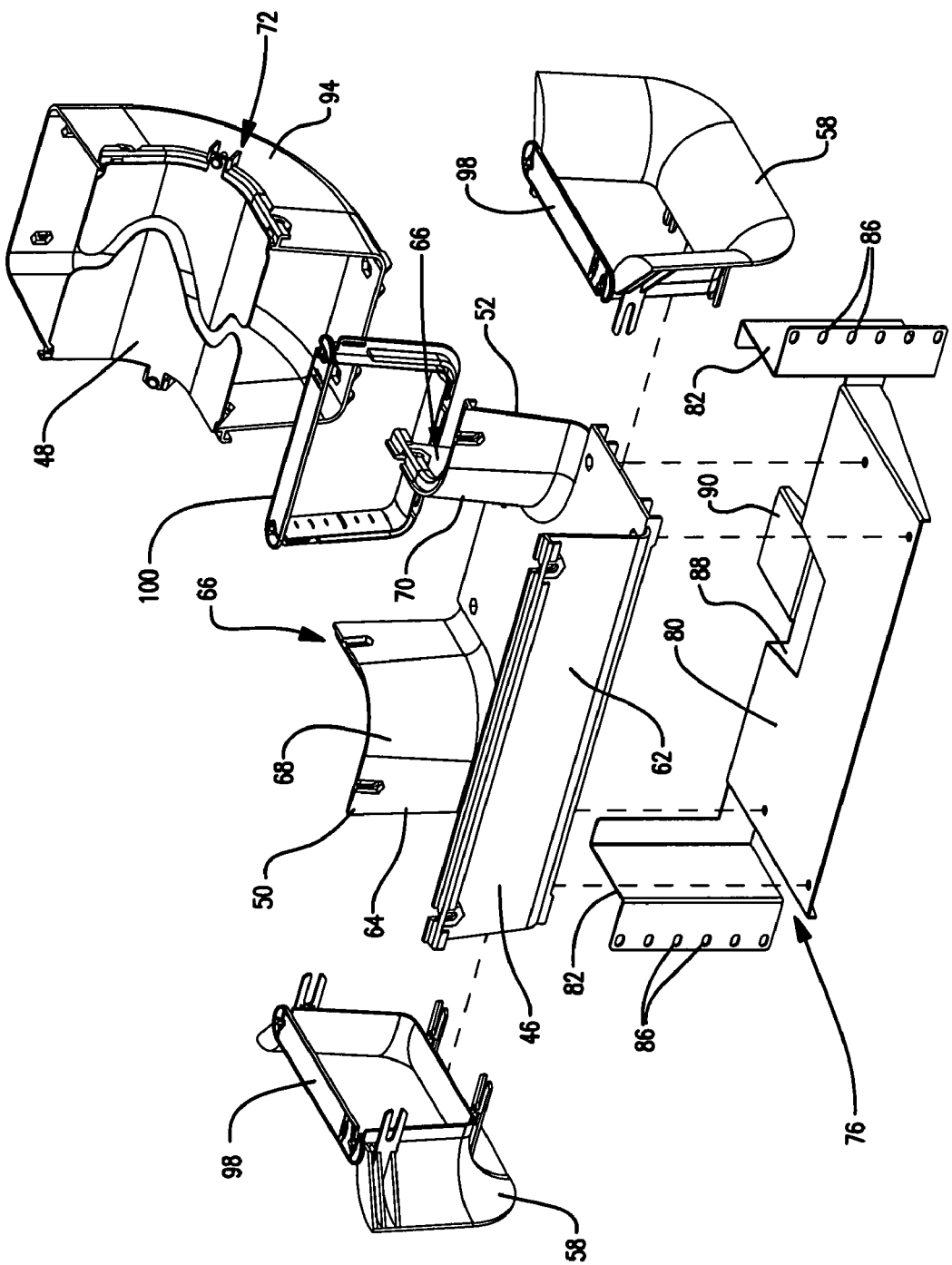
FIG. 7 is an exploded perspective view of the cable exit assembly of FIG. 1, shown in isolation.

Referring now to FIGS. 5 and 7, to protect the fiber cables at the transition from the vertical routing of the vertical cable routing structures 42, 44 to the horizontal routing of the horizontal trough section 46, radius limiters 58 are provided at each of the ends 50, 52 of the horizontal trough section 46. The radius limiters 58 include a trumpet flare construction to limit the bend radius of the fiber cables to no less than a 1.5 inch bend radius during the transition. Cable retainers 98 are located across the top of the radius limiters 58 to retain the cables 32, 34 within the horizontal trough section 46.

Figure 8:
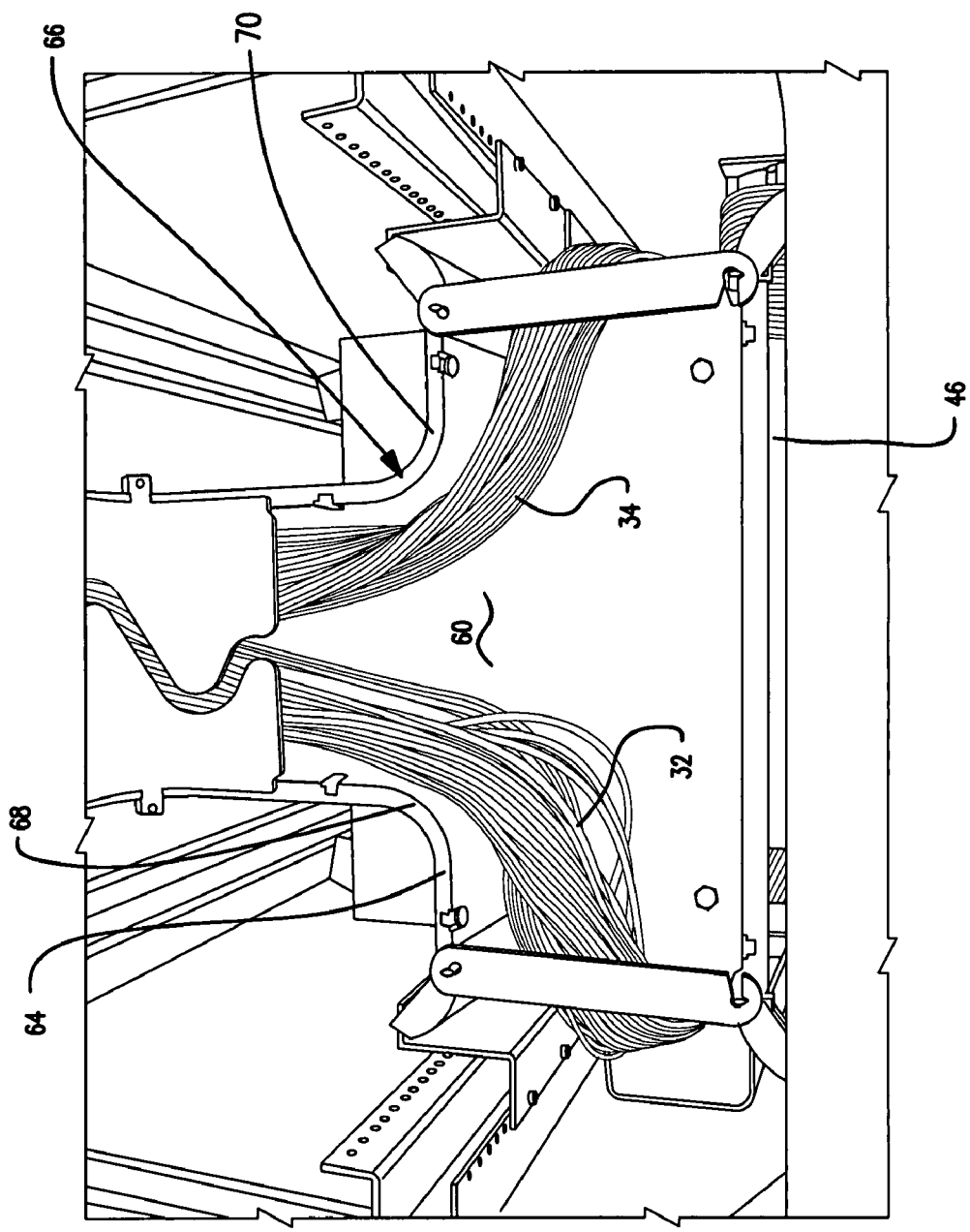
FIG. 8 is a top plan view of the cable exit assembly of the telecommunications system of FIG. 1.

As illustrated in FIG. 7, the horizontal cable trough section 46 of the cable exit assembly 12 generally includes a front wall 62 and a rear wall 64 that partly define a U-shaped cross-section. Referring to FIG. 8, the cable exit assembly 12 defines a collection region 60 at which the cables 32, 34 from each of the vertical cable routing structures 42, 44 are collected or merged. In the illustrated embodiment, the collection region 60 is defined by an exit or perpendicular transition region 66 formed in the rear wall 64 of the horizontal trough section 46. The perpendicular transition region 66 includes curved upstanding rear wall portions 68, 70 that limit the bend radius of the cables 32, 34 to no less than 1.5 inches as the cables transition from a horizontal side-to-side routing to a horizontal rearward routing.

Figure 9:
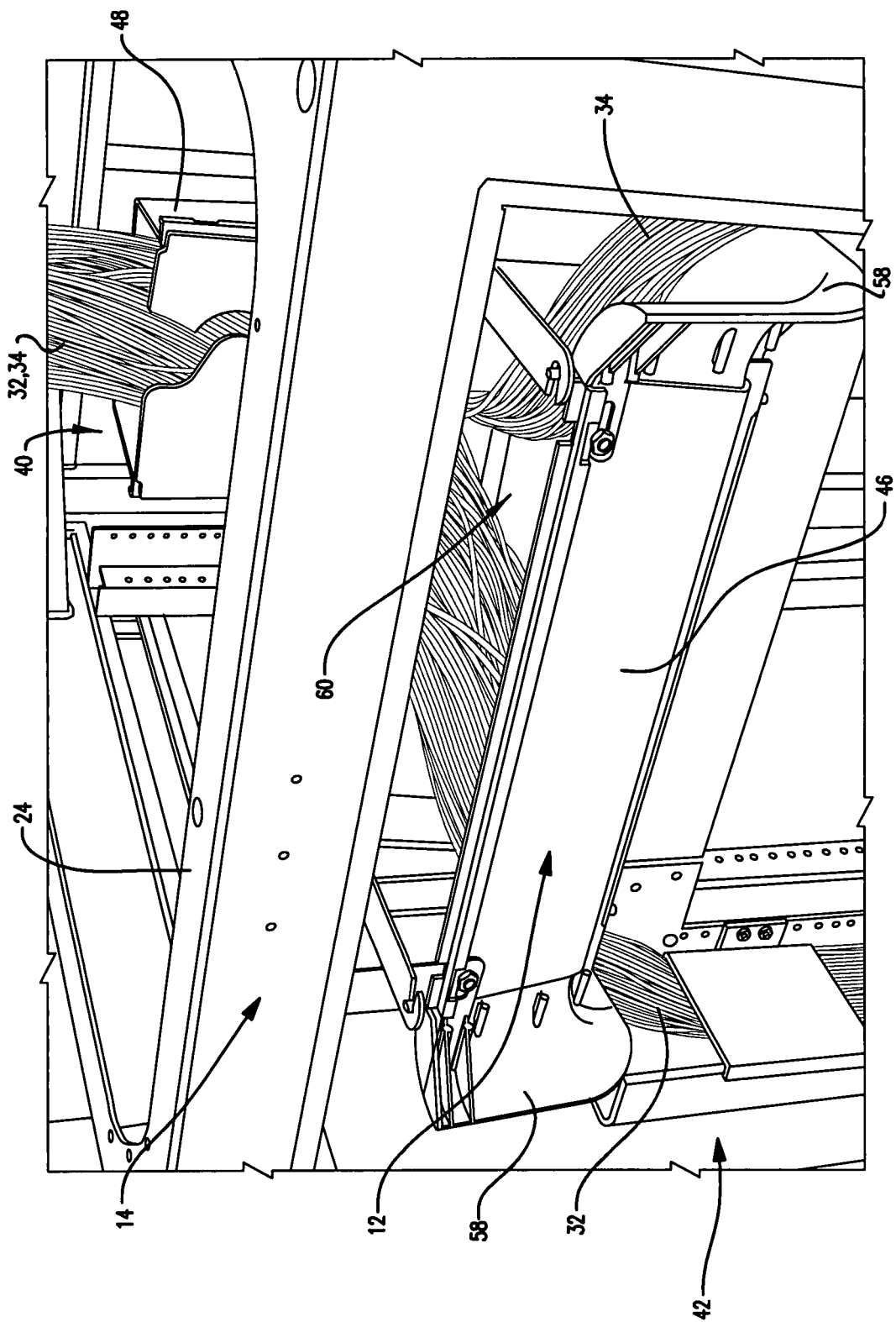
FIG. 9 is a side perspective view of the cable exit assembly of the telecommunications system of FIG. 1.

Referring back to FIG. 7, the vertical cable trough section 48 of the cable exit assembly 12 is secured to the horizontal trough section 46 at the perpendicular transition region 66 formed in the rear wall 64. A coupler or junction piece 100 along with connection bars (not shown) are used to attached the vertical cable trough section 48 to the horizontal trough section 46. As illustrated in FIG. 9, the vertical cable trough section 48 defines the common exit point 40 of the cabinet 14. In particular, the vertical cable trough section 48 routes the collected or merged cables 32, 34 upward through the top 24 of the cabinet 14.

Referring again to FIG. 7, the vertical cable trough section 48 is constructed with a curved transition region 94 that transitions the horizontal cable routing to a vertical cable routing. The curved transition region 94 is constructed to limit the bend radius of the cables 32, 34 to no less than 1.5 inches. In the illustrated embodiment, the vertical cable trough section 48 includes a 90 degree elbow 72 having an end that defines the common exit point 40.

Figure 10:
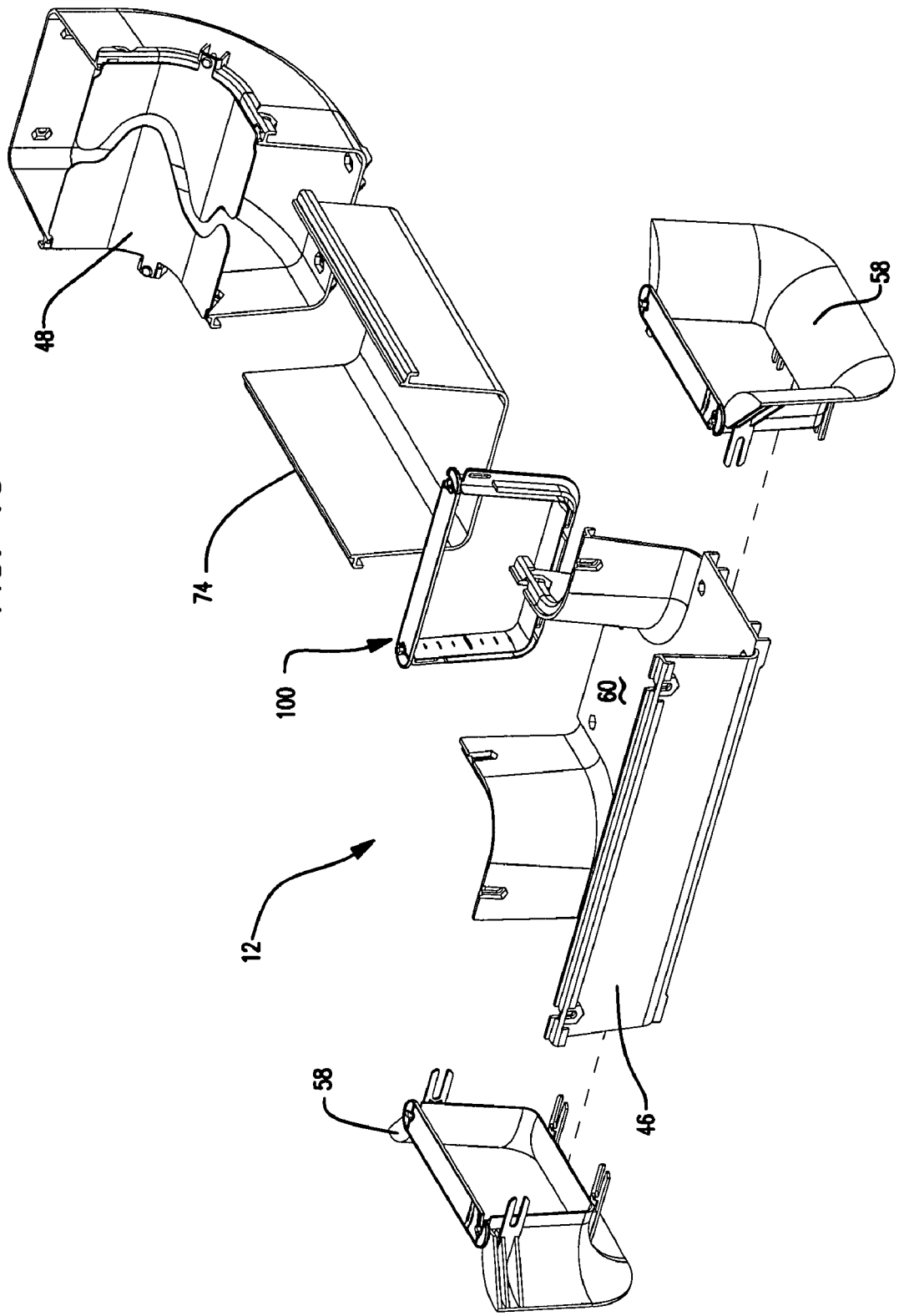
FIG. 10 is an exploded perspective view of another embodiment of a cable exit assembly including an intermediate cable trough section.

Referring now to FIG. 10, the cable exit assembly 12 can further include an intermediate trough section 74 located between the horizontal trough section 46 and the vertical cable trough section 48. Couplers (e.g., 100, only one shown) along with connection bars (not shown) are used to attached the intermediate trough section 74 to the vertical cable trough section 48 and the horizontal trough section 46. The intermediate trough section 74 routes the collected cables 32, 34 rearward from the horizontal trough section 46 toward the vertical cable trough section 48. The intermediate trough section 74 permits a user to locate the common exit point 40 a distance further from the collection region 60, if needed. The intermediate trough section 74 can also be used to locate the common exit point 40 of the cabinet at a different distance from the front 16 of the cabinet; thereby permitting the user to configure the cabinet to better coincide with the location of overhead cable pathway structures 96, for example.

Referring back to FIG. 7, the cable exit assembly 12 utilizes a mounting bracket 76 that supports and mounts the cable exit assembly 12 to vertical upright side rails 78 (FIG. 2) of the cabinet frame 30. The mounting bracket 76 includes a mounting plate 80 and rail mounting flanges 82. The horizontal cable trough section 46 of the cable exit assembly 12 mounts directly to the mounting plate 80 by fasteners 84 (FIGS. 3 and 4).

Referring to FIGS. 7 and 3, an aperture 88 is located in the plate 80 to permit access to the connection 92 (e.g., fasteners) between the horizontal trough section 46 and the vertical cable trough section 48. A rearward-extending flange 90 is centrally located on the mounting plate 80. The rearward-extending flange 90 generally supports the vertical cable trough section 48 when mounted to the horizontal trough section 46.

The rail mounting flanges 82 of the mounting bracket 76 each include an L-shaped portion having mounting holes 86 for mounting the bracket 76, and the cable exit assembly 12 to the rails 78 of the cabinet frame 30. The mounting holes 86 are patterned to mount to all standard cabinet rails having a particular width. In another embodiment, the rail mounting flanges 82 may be adjustable, e.g., extendable, to accommodate cabinet frames having varying widths.

In general, the present cable exit assembly 12 functions as a collection assembly for fiber cables exiting the telecommunications cabinet 14. In particular, the groups of fiber cables 32, 34 routed upward along each of the sides 20, 22 of the cabinet 14 are merged together at the top 24 of the cabinet and then routed out of the cabinet at the common exit point 40.

The above specification provides a complete description of the present invention. Since many embodiments of the invention can be made without departing from the spirit and scope of the invention, certain aspects of the invention reside in the claims hereinafter appended.

What is claimed is:

1. A telecommunications cabinet, comprising:
   a) a cabinet frame having a top, a bottom, a front, a rear, and opposite sides;
   b) telecommunications equipment mounted to the cabinet frame;
   c) fiber cables interconnected to the telecommunications equipment;
   d) first and second vertical cable routing structures located at the opposite sides of the cabinet frame, the fiber cables being routed from the equipment to the first and second vertical cable routing structures; and
   e) a cable exit assembly located within the cabinet frame adjacent to the top, the cable exit assembly including a horizontal cable trough section having radius-limiting ends that limit the bend radius of the fiber cables during a transition from the first and second vertical cable routing structures to the horizontal cable trough section, the cable exit assembly defining a common exit point for the fiber cables routed within both the first and second vertical cable routing structures.

2. The cabinet of claim 1, wherein a first end of the radius-limiting ends of the horizontal cable trough section is located adjacent to an exit of one of the vertical cable routing structures, and a second end of the radius-limiting ends is located adjacent to an exit of the other of the vertical cable routing structure.

3. The cabinet of claim 1, wherein the cable exit assembly includes a collection region, fiber cables from the first vertical cable routing structure and fiber cables from the second vertical cable routing structure merging together at the collection region.

4. The cabinet of claim 3, wherein the collection region is defined by an exit region formed in a rear wall of the horizontal cable trough section.

5. The cabinet of claim 4, wherein the cable exit assembly includes a vertical cable trough section that routes the collected cables upward through the top of the cabinet frame, the vertical cable trough section defining the common exit point.

6. The cabinet of claim 5, wherein the vertical cable trough section includes a 90 degree elbow having an end that defines the common exit point.

7. The cabinet of claim 5, wherein the cable exit assembly includes an intermediate cable trough section interconnected between the horizontal cable trough section and the vertical cable trough section, the intermediate cable trough section routing the collected cables rearward from the horizontal cable trough section toward the vertical cable trough section.

8. The cabinet of claim 1, further include a mounting bracket configured to mount the horizontal cable trough section to side rails of the cabinet frame.

9. A method of routing fiber cables within a telecommunications cabinet, the method comprising the steps of:
   a) routing a first group of fiber cables up a first vertical cable routing structure located at one side of the a cabinet frame;
   b) routing a second group of fiber cables up a second vertical cable routing structure located at an opposite side of the cabinet frame;
   c) routing each of the first group and the second group of fiber cables toward one another in a horizontal cable trough section of a cable exit assembly, the horizontal cable trough section being located within the telecommunications cabinet;
   d) merging the routings of each of the first group and the second group of fiber cables in the horizontal cable trough section at a collection region defined by the cable exit assembly;
   e) routing the merged fiber cables through an intermediate cable trough section interconnected between the horizontal cable trough section and a vertical cable trough section; and
   f) routing the merged fiber cables out a top of the cabinet frame at a common exit point defined by the vertical cable trough section.

10. The method of claim 9, wherein the step of routing each of first and second group of fiber cables toward one another includes transitioning each group from a vertical routing pathway to a horizontal routing pathway.

11. A mounting bracket and cable trough assembly, comprising:
   a) a horizontal cable trough section having first and second ends;
   b) radius limiters mounted to the first and second ends of the horizontal cable trough section, each of the radius limiters having a trumpet flare construction;
   c) a vertical cable trough section interconnected to an open transition region formed in a rear wall of the horizontal cable trough section, the vertical cable trough section including an upward elbow construction;
   d) a mounting bracket having a mounting plate and side flanges, the side flanges being spaced apart to mount to side rails within an interior of a telecommunications cabinet.

12. A telecommunications cabinet, comprising:
   a) a cabinet frame having a top, a bottom, a front, a rear, and opposite sides, the cabinet frame defining an interior equipment region;
   b) first and second vertical cable routing structures located at the opposite sides of the cabinet frame; and
   c) a cable exit assembly located within the cabinet frame adjacent to the top, the cable exit assembly including a horizontal cable trough section having first and second radius-limiting ends, the first end being located adjacent to an exit of one of the vertical cable routing structures, the second end being located adjacent to an exit of the other of the vertical cable routing structure, the first and second radius-limiting ends at least partially defining transition regions between the vertical cable routing structures and the horizontal cable trough section, the cable exit assembly defining a common exit point through the top of the cabinet frame for fiber cables routed within both the first and second vertical cable routing structures.

13. The cabinet of claim 12, further including fiber cables routed within both the first and second vertical cable routing structures.

14. The cabinet of claim 13, wherein the cable exit assembly includes a collection region at which fiber cables routed from the first and second vertical cable routing structures are merged together.

15. The cabinet of claim 12, further including telecommunications equipment mounted within the interior equipment region defined by the cabinet frame.

16. The cabinet of claim 15, further including fiber cables interconnected to the telecommunications equipment; the fiber cables being routed from the equipment to the first and second vertical cable routing structures.

17. The cabinet of claim 12, wherein a horizontal cable routing pathway exit is formed in a rear wall of the horizontal cable trough section.

18. The cabinet of claim 17, wherein the cable exit assembly includes a vertical cable trough section interconnected to the horizontal cable trough section, the vertical cable trough section defining both the common exit point and a common cable routing pathway extending toward the common exit point.

19. The cabinet of claim 18, wherein the vertical cable trough section includes a 90 degree elbow having an end that defines the common exit point.

20. The cabinet of claim 18, wherein the cable exit assembly includes an intermediate cable trough section interconnected between the horizontal cable trough section and the vertical cable trough section, the intermediate cable trough section defining an intermediate cable routing pathway that extends between the horizontal cable routing pathway exit and the common cable routing pathway.

21. The cabinet of claim 12, further include a mounting bracket configured to mount the horizontal cable trough section to side rails of the cabinet frame.

22. A telecommunications cabinet, comprising:
 a) a cabinet frame having a top, a bottom, a front, a rear, and opposite sides;
 b) telecommunications equipment mounted to the cabinet frame;
 c) fiber cables interconnected to the telecommunications equipment;
 d) first and second vertical cable routing structures located at the opposite sides of the cabinet frame, the fiber cables being routed from the equipment to the first and second vertical cable routing structures; and
 e) a cable exit assembly located within the cabinet frame adjacent to the top, the cable exit assembly having a common exit point for the fiber cables routed within both the first and second vertical cable routing structures, the cable exit assembly including a horizontal cable trough section, a vertical cable trough section, and an intermediate cable trough section interconnected between the horizontal cable trough section and the vertical cable trough section, the intermediate cable trough section routing the fiber cables rearward from the horizontal cable trough section toward the vertical cable trough section, the vertical cable trough section defining the common exit point.

23. The cabinet of claim 22, wherein the horizontal cable trough section has a first end located adjacent to an exit of one of the vertical cable routing structures, and a second end located adjacent to an exit of the other of the vertical cable routing structure.

24. The cabinet of claim 22, wherein the cable exit assembly includes a collection region, fiber cables from the first vertical cable routing structure and fiber cables from the second vertical cable routing structure merging together at the collection region.

25. The cabinet of claim 24, wherein the collection region is defined by an exit region formed in a rear wall of the horizontal cable trough section.

26. The cabinet of claim 22, wherein the vertical cable trough section includes a 90 degree elbow having an end that defines the common exit point.

27. The cabinet of claim 22, further include a mounting bracket configured to mount the horizontal cable trough section to side rails of the cabinet frame.

28. A telecommunications cabinet, comprising:
 a) a cabinet frame having a top, a bottom, a front, a rear, and opposite sides, the cabinet frame defining an interior equipment region;
 b) first and second vertical cable routing structures located at the opposite sides of the cabinet frame; and
 c) a cable exit assembly located within the cabinet frame adjacent to the top, the cable exit assembly defining a common exit point through the top of the cabinet frame for fiber cables routed within both the first and second vertical cable routing structures, the cable exit assembly including:
  i) a horizontal cable trough section having first and second ends, the first end located adjacent to an exit of one of the vertical cable routing structures, the second end located adjacent to an exit of the other of the vertical cable routing structure, the horizontal cable trough section defining a horizontal cable routing pathway exit;
  ii) a vertical cable trough section defining a common cable routing pathway that leads to the common exit point; and
  iii) an intermediate cable trough section interconnected between the horizontal cable trough section and the vertical cable trough section, the intermediate cable trough section defining an intermediate cable routing pathway that extends between the horizontal cable routing pathway exit and the common cable routing pathway.

29. The cabinet of claim 28, further including fiber cables routed within both the first and second vertical cable routing structures.

30. The cabinet of claim 29, wherein the cable exit assembly includes a collection region at which fiber cables routed from the first and second vertical cable routing structures are merged together.

31. The cabinet of claim 28, further including telecommunications equipment mounted within the interior equipment region defined by the cabinet frame.

32. The cabinet of claim 31, further including fiber cables interconnected to the telecommunications equipment; the fiber cables being routed from the equipment to the first and second vertical cable routing structures.

33. The cabinet of claim 28, wherein the horizontal cable routing pathway exit is formed in a rear wall of the horizontal cable trough section.

34. The cabinet of claim 28, wherein the vertical cable trough section defines both the common exit point and the common cable routing pathway extending toward the common exit point.

35. The cabinet of claim 34, wherein the vertical cable trough section includes a 90 degree elbow having an end that defines the common exit point.

36. The cabinet of claim 28, further include a mounting bracket configured to mount the horizontal cable trough section to side rails of the cabinet frame.

* * * * *

UNITED STATES PATENT AND TRADEMARK OFFICE
CERTIFICATE OF CORRECTION

PATENT NO. : 7,829,787 B2
APPLICATION NO. : 11/906330
DATED : November 9, 2010
INVENTOR(S) : Hruby et al.

It is certified that error appears in the above-identified patent and that said Letters Patent is hereby corrected as shown below:

Col. 5, lines 63-64, claim 9: "one side of the a cabinet" should read --one side of a cabinet--

Col. 8, line 4, claim 27: "further include a mounting" should read --further including a mounting--

Col. 8, line 60, claim 36: "further include a mounting" should read --further including a mounting--

Signed and Sealed this
Thirteenth Day of September, 2011

David J. Kappos
*Director of the United States Patent and Trademark Office*